US012804840B2

(12) United States Patent
Wang et al.

(10) Patent No.: US 12,804,840 B2
(45) Date of Patent: Nov. 17, 2026

(54) INFORMATION HANDLING SYSTEM HIGH PERFORMANCE MODULE MULTI-FUNCTION HANDLE COMPONENT

(71) Applicant: Dell Products L.P., Round Rock, TX (US)

(72) Inventors: Ching-Yuan Wang, New Taipei City (TW); Edward Crofts, Auburndale, MA (US); Chih-Ta Huang, Taipei (TW); Tingchun Kuo, Taipei City (TW)

(73) Assignee: Dell Products L.P., Round Rock, TX (US)

( * ) Notice: Subject to any disclaimer, the term of this patent is extended or adjusted under 35 U.S.C. 154(b) by 119 days.

(21) Appl. No.: 18/812,408

(22) Filed: Aug. 22, 2024

(65) Prior Publication Data

US 2026/0059688 A1 Feb. 26, 2026

(51) Int. Cl.
*H05K 7/14* (2006.01)
*G06F 1/184* (2026.01)
*H05K 7/20* (2006.01)

(52) U.S. Cl.
CPC ........... *H05K 7/1489* (2013.01); *G06F 1/184* (2013.01); *H05K 7/1492* (2013.01); *H05K 7/20145* (2013.01); *H05K 7/20727* (2013.01)

(58) Field of Classification Search
CPC .. H05K 7/1487; H05K 7/1489; H05K 7/1492; H05K 7/20145; H05K 7/20727; G06F 1/184; G06F 1/20; G06F 1/206; G06F 15/161
USPC ......................................... 361/737, 801, 803
See application file for complete search history.

(56) References Cited

U.S. PATENT DOCUMENTS

| | | | | |
|---|---|---|---|---|
| 7,321,489 B2 * | 1/2008 | McAlister | G06F 1/187 | 361/679.33 |
| 10,936,527 B1 * | 3/2021 | Chen | G06F 1/185 | |
| 2016/0037673 A1 * | 2/2016 | Chen | H05K 7/1492 | 361/679.02 |
| 2021/0136948 A1 * | 5/2021 | Tanaka | H05K 1/0203 | |
| 2024/0237259 A9 * | 7/2024 | Lin | H05K 7/1489 | |

* cited by examiner

*Primary Examiner* — Allen L Parker
*Assistant Examiner* — Peter Krim
(74) *Attorney, Agent, or Firm* — Terrile, Cannatti & Chambers, LLP; Stephen A. Terrile

(57) ABSTRACT

A multi-function handle component for a server type information handling system. The multi-function handle component for a server type information handling system includes a motherboard tray portion, the motherboard tray portion being configured to attach to a motherboard of the server type information handling system and a grasping structure physically attached to the motherboard tray portion, the grasping structure being configured to minimize obstruction of an airflow area of the multi-function handling component.

12 Claims, 11 Drawing Sheets

INFORMATION HANDLING SYSTEM HIGH PERFORMANCE MODULE MULTI-FUNCTION HANDLE COMPONENT

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing high performance component multi-function handle component. In certain embodiments, the system and method includes a multi-function handle component which facilitates manipulation of a high performance module while facilitating air flow from a fan system.

In one embodiment, the invention relates to multi-function handle component for a server type information handling system, comprising: a motherboard tray portion, the motherboard tray portion being configured to attach to a motherboard of the server type information handling system; and, a grasping structure physically attached to the motherboard tray portion, the grasping structure being configured to minimize obstruction of an airflow area of the multi-function handling component.

In another embodiment, the invention relates to server type information handling system comprising a processor; a data bus coupled to the processor; a motherboard, the processor and the data bus being associated with the motherboard; and, a multi-function handle component physically attached to the motherboard, the multi-function handle component comprising motherboard tray portion, the motherboard tray portion being configured to attach to a motherboard of the server type information handling system; and, a grasping structure physically attached to the motherboard tray portion, the grasping structure being configured to minimize obstruction of an airflow area of the multi-function handling component.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
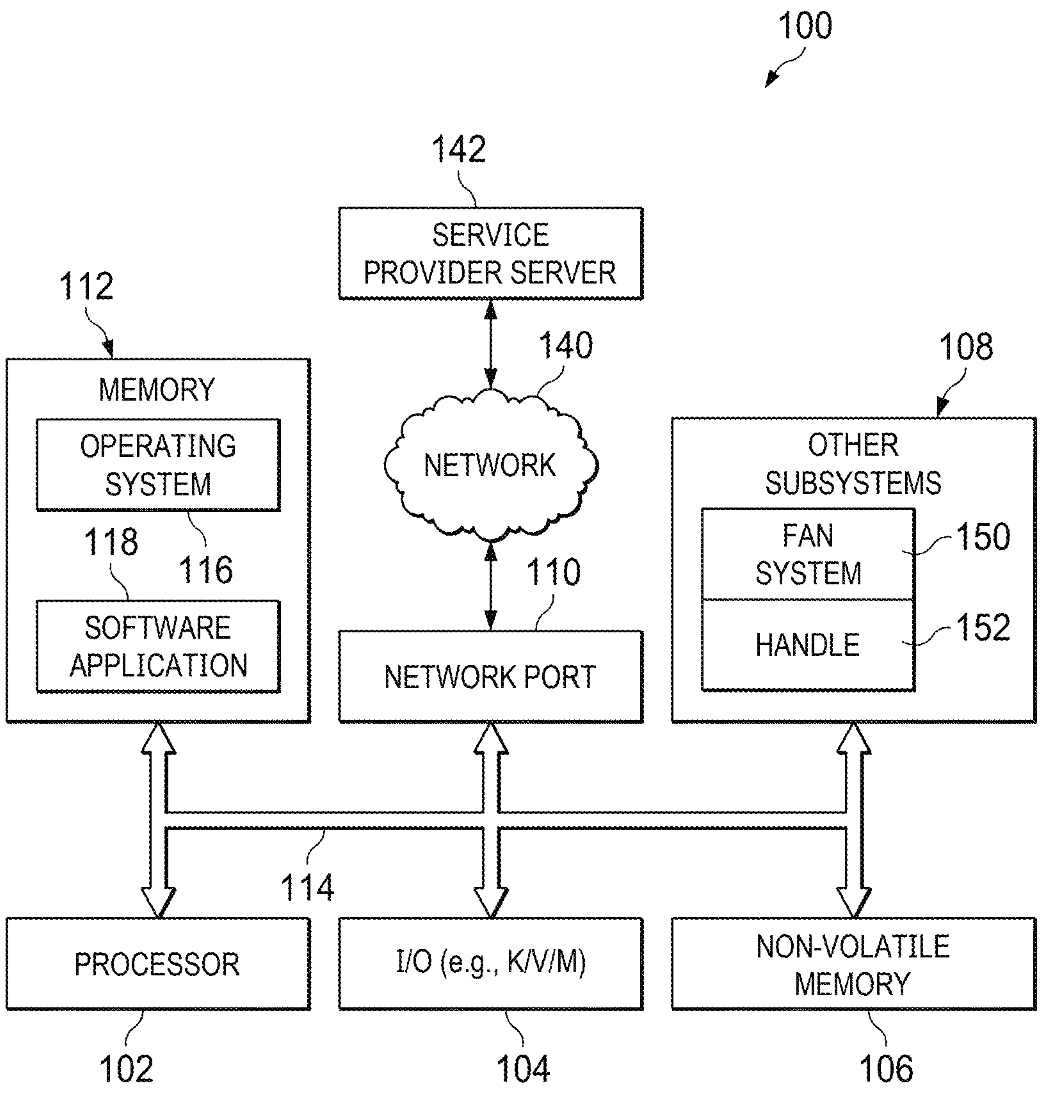
FIG. 1 shows a general illustration of components of an information handling system as implemented in the system and method of the present invention.

Various aspects of the disclosure include an appreciation that information handling systems often include a motherboard, which is sometimes instantiated as a high performance module (HPM). Various aspects of the present disclosure include an appreciation that a HPM type motherboard provides a motherboard which is modular, scalable and pluggable. Various aspects of the present disclosure include an appreciation that information handling systems, such as server type information handling system, often include a motherboard handle (also referred to as an HPM handle) to assist with physically manipulating the motherboard. Various aspects of the present disclosure include an appreciation that with many server type information handling systems, the motherboard handle is often positioned along a front side of the motherboard.

Various aspects of the present disclosure include an appreciation that the motherboard handle is often positioned between a fan gantry and a motherboard tray. Various aspects of the present disclosure include an appreciation that so positioning the motherboard handle can obstruct the fan outlet and diminish the efficiency of air cooling. Various aspects of the present disclosure include an appreciation that with server type information handling systems which include an enlarged heatsink, this issue is even more pronounced as the motherboard handle is positioned even closer to the fan area. Various aspects of the present disclosure include an appreciation that certain server type information handling systems provide an airflow bypass between the heatsink and the motherboard which can also lead to a decrease in cooling efficiency. Various aspects of the present disclosure include an appreciation that while installing an air baffle on the motherboard could mitigate this issue, fitting both a handle and an air baffle into the compact space can be challenging.

Various aspects of the present disclosure include an appreciation that there are a plurality of known handle designs. These known handle designs include a one-piece handle which can help with firmly holding a motherboard, but also obstructs a significant portion of the fan outlet area. Another known handle design includes a telescopic handle, which extends only when in use. However, a telescopic handle often requires two parts, which can lead to additional assembly complexity potentially resulting in an additional tooling fee.

Accordingly, various aspects of the present disclosure include an appreciation that it would be desirable to provide a motherboard handle which addresses the aforementioned issues.

A system and method are disclosed for providing a multi-function handle component which facilitates manipulation of a high performance module while facilitating air flow from a fan system. In certain embodiments, the multi-function handle component includes a grasping structure which minimizes the area obstructed by the handle. In certain embodiments, the grasping structure of multi-function handle component is configured as a multi-surface grasping structure. In certain embodiments, the multi-surface grasping structure facilitates manipulation of the motherboard with two fingers.

In certain embodiments, the multi-function handle component includes a motherboard tray portion. In certain embodiments, the motherboard tray portion is held firmly via a plurality of fasteners so as to fix the multi-function handle component to the motherboard. In certain embodiments, the motherboard tray portion defines apertures that correspond to a motherboard specification so that there is no need to change the motherboard layout, the fan board layout, or a combination thereof. In certain embodiments, the motherboard specification includes an open compute project (OCP) specification such as the data center modular hardware system (DC-MHS) motherboard specification.

In certain embodiments, the multi-function handle component includes an air baffle portion. In certain embodiments, the air baffle portion increases the thermal support of the handle component. In certain embodiments, the air baffle portion is positioned along an edge of the handle component. In certain embodiments, the air baffle portion is positioned along a rear edge of the handle component. In certain embodiments, the air baffle portion directs airflow to particular locations within the system. In certain embodiments, the particular locations include a processor area of the system. In certain embodiments, the air baffle portion defines one or more air flow windows. In certain embodiments, the one or more air flow windows may be exposed to adjust air flow to a cooling target, such as a processor.

Accordingly, such a multi-function handle component facilitates airflow management within the system. Additionally, the multi-function handle component blocks less airflow than known handle designs. Additionally, such a multi-function handle component is particularly useful when used in limited height chassis designs such as 1 U type chassis. Additionally, such a multi-function handle component can advantageously reduce system part counts and provide system cost benefits.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a rack server type information handling system. As used herein, a rack server type information handling system broadly refers to an information handling system which is physically configured to be mounted within a server rack.

In certain embodiments, the information handling system 100 includes a fan system 150 and a multi-function handle component 152. In certain embodiments, the multi-function handle component 152 facilitates manipulation of a high performance module while facilitating air flow from a fan system. In certain embodiments, the multi-function handle component 152 includes a grasping structure which minimizes the area obstructed by the handle. In certain embodiments, the grasping structure of multi-function handle component 152 is configured as a multi-surface grasping structure. In certain embodiments, the multi-surface grasping structure facilitates manipulation of the motherboard with two fingers.

In certain embodiments, the multi-function handle component 152 includes a motherboard tray portion. In certain embodiments, the motherboard tray portion is held firmly via a plurality of fasteners so as to fix the multi-function handle component 152 to the motherboard. In certain embodiments, the motherboard tray portion defines apertures that correspond to a motherboard specification so that there is no need to change the motherboard layout, the fan board layout, or a combination thereof. In certain embodiments, the motherboard specification includes an open compute project (OCP) specification such as the data center modular hardware system (DC-MHS) motherboard specification.

In certain embodiments, the multi-function handle component 152 includes an air baffle portion. In certain embodiments, the air baffle portion increases the thermal support of the handle component. In certain embodiments, the air baffle portion is positioned along an edge of the handle component. In certain embodiments, the air baffle portion is positioned along a rear edge of the handle component. In certain embodiments, the air baffle portion directs airflow to particular locations within the system. In certain embodiments, the particular locations include a processor area of the system. In certain embodiments, the air baffle portion defines one or more air flow windows. In certain embodiments, the one or more air flow windows may be exposed to adjust air flow to a cooling target, such as a processor.

Accordingly, the multi-function handle component 152 facilitates airflow management within the system. Additionally, the multi-function handle component blocks less airflow than known handle designs. Additionally, the multi-function handle component 152 is particularly useful when used in limited height chassis designs such as 1 U type chassis. Additionally, such the multi-function handle component 152 can advantageously reduce system part counts and provide system cost benefits.

Figure 2:
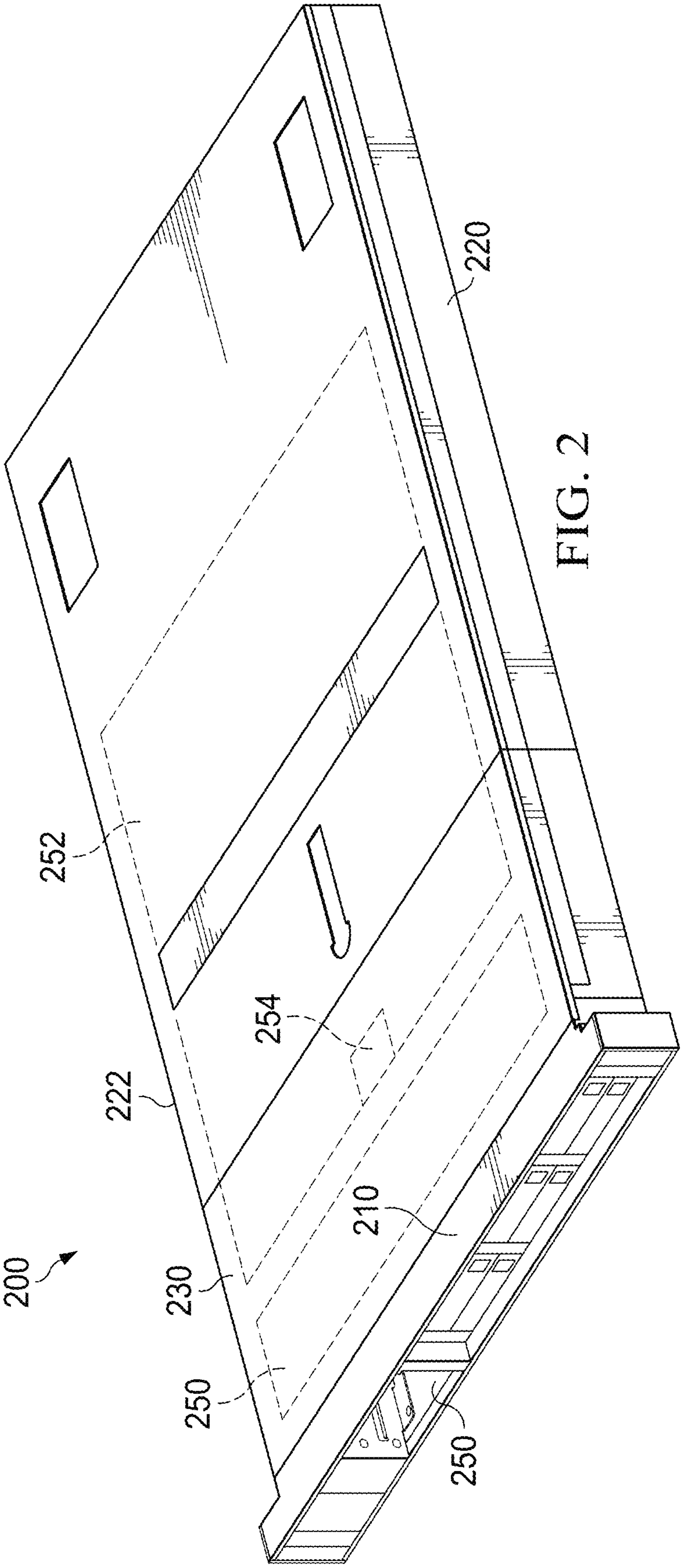
FIG. 2 shows a generalized perspective view of an example rack server type information handling system.

FIG. 2 shows a generalized perspective view of an example rack server type information handling system 200. In certain embodiments, the rack server type information handling system includes a front portion 210, which is accessible when the rack server type information handing system 200 is mounted on a server rack. In certain embodiments, the side portions 220, 222 mount to the rack via respective server mounting components. In certain embodiments, the side portions mount to the rack via respective mechanical guiding features which are mechanically coupled to respective server mounting components. In certain embodiments, the rack server type information handling system can slide out from the rack via the respective mechanical guiding features. In certain embodiments, the rack type information handing system 200 includes a bay 250 via which components may be mounted to the rack type information handling system.

In certain embodiments, the information handling system 200 may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high. In certain embodiments, the plurality of service sizes includes open rack (OU) server sizes. As used herein, an open rack server size broadly refers to a standardized server system height conforming to an OpenRack standard.

In certain embodiments, the information handling system 200 includes a fan system 250 a motherboard 252 and a multi-function handle component 254. In certain embodiments, the multi-function handle component 254 facilitates manipulation of a high performance module while facilitating air flow from a fan system. In certain embodiments, the multi-function handle component 254 includes a grasping structure which minimizes the area obstructed by the handle. In certain embodiments, the grasping structure of multi-function handle component 254 is configured as a multi-surface grasping structure. In certain embodiments, the multi-surface grasping structure facilitates manipulation of the motherboard with two fingers.

In certain embodiments, the multi-function handle component 254 includes a motherboard tray portion. In certain embodiments, the motherboard tray portion is held firmly via a plurality of fasteners so as to fix the multi-function handle component 254 to the motherboard. In certain embodiments, the motherboard tray portion defines apertures that correspond to a motherboard specification so that there is no need to change the motherboard layout, the fan board layout, or a combination thereof. In certain embodiments, the motherboard specification includes an open compute project (OCP) specification such as the data center modular hardware system (DC-MHS) motherboard specification.

In certain embodiments, the multi-function handle component 254 includes an air baffle portion. In certain embodiments, the air baffle portion increases the thermal support of the handle component. In certain embodiments, the air baffle portion is positioned along an edge of the handle component. In certain embodiments, the air baffle portion is positioned along a rear edge of the handle component. In certain embodiments, the air baffle portion directs airflow to particular locations within the system. In certain embodiments, the particular locations include a processor area of the system. In certain embodiments, the air baffle portion defines one or more air flow windows. In certain embodiments, the one or more air flow windows may be exposed to adjust air flow to a cooling target, such as a processor.

Figure 3A:
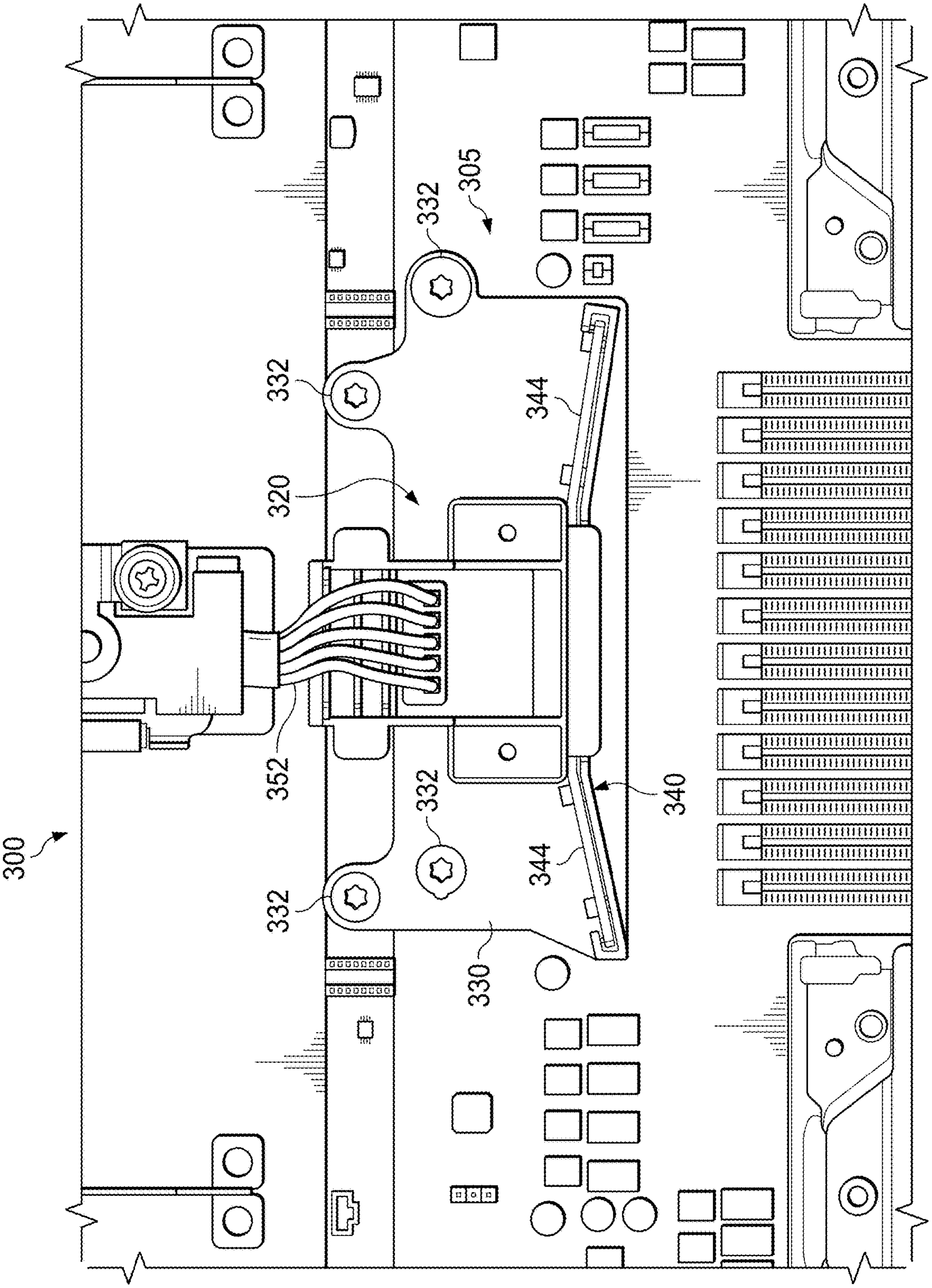
FIGS. 3A, 3B and 3C, generally referred to as FIG. 3, show views of a high performance module multifunction handle component.
Figure 3B:
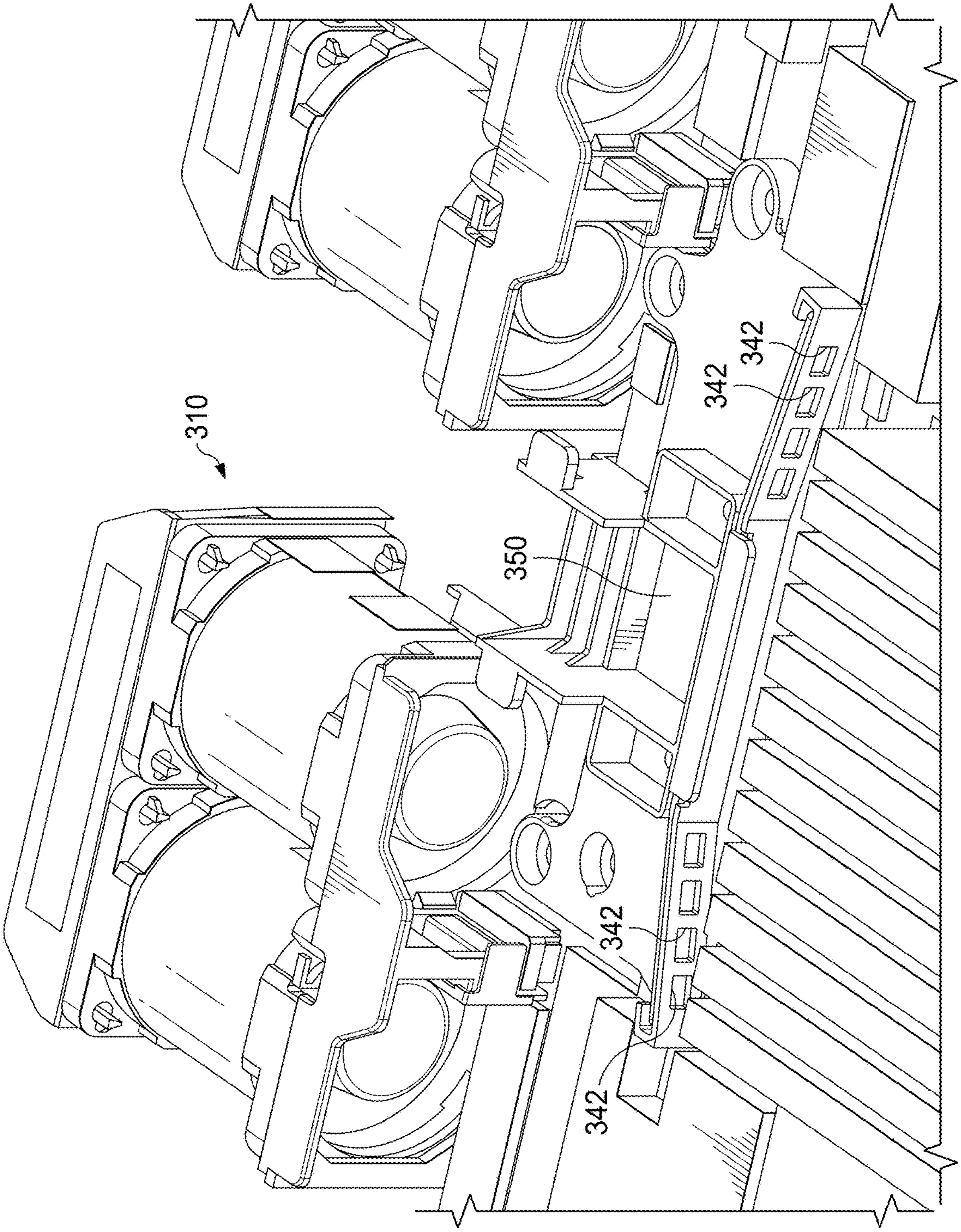
Figure 3C:
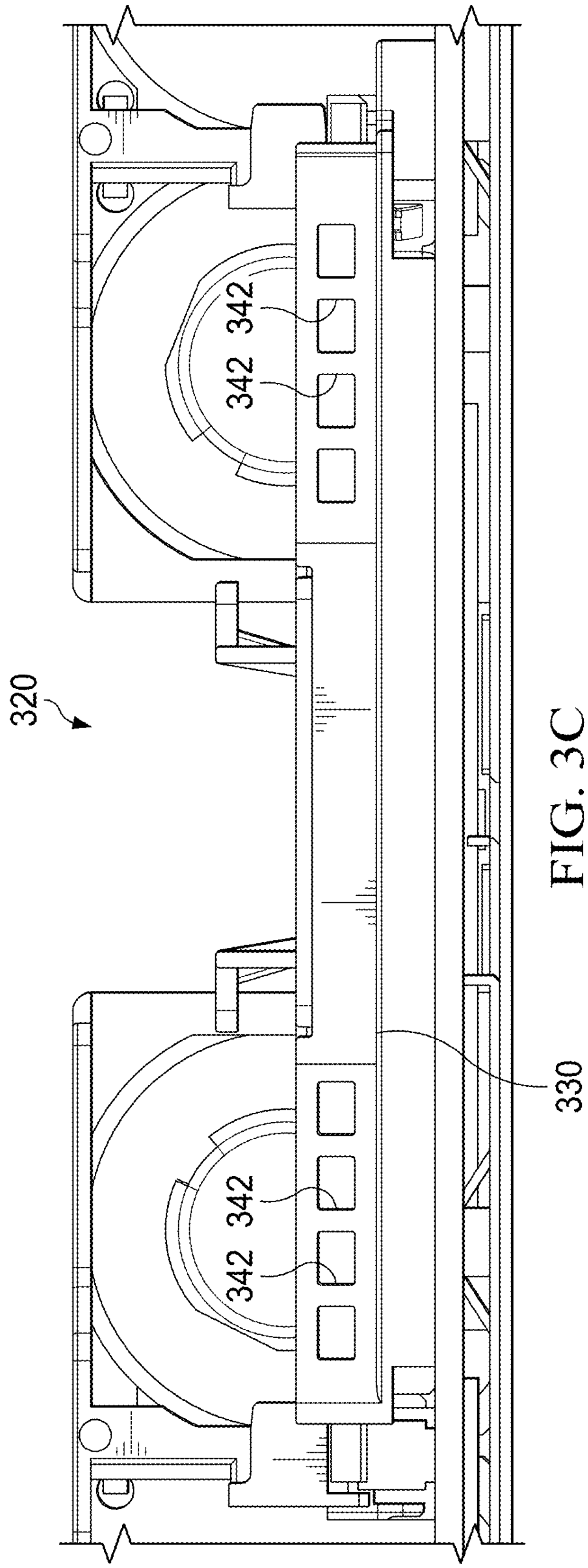

FIGS. 3A, 3B and 3C, generally referred to as FIG. 3, show views of an information handling system 300 with a high performance module multi-function handle component 305. More specifically, FIG. 3A shows a cut away top view of a portion of an information handling system 300 with a high performance module multi-function handle component 305. FIG. 3B shows a cut way perspective view of an information handling system 300 with a high performance module multi-function handle component 305. FIG. 3C shows a cut away rear view of a portion of an information handling system 300 with a high performance module multi-function handle component 305. In certain embodiments, the information handling system 300 corresponds to information handling system 100. In certain embodiments, the high performance module multi-function handle 305 corresponds to multi-function handle 152.

In certain embodiments, the information handling system 300 includes a fan system 310 and the multi-function handle component 305. In certain embodiments, the multi-function handle component 305 facilitates manipulation of a high performance module while facilitating air flow from a fan system. In certain embodiments, the multi-function handle component 305 includes a grasping structure 320 which minimizes the area obstructed by the handle. In certain embodiments, the grasping structure 320 of multi-function handle component 305 is configured as a multi-surface grasping structure. In certain embodiments, the multi-surface grasping structure facilitates manipulation of the motherboard 322 with two fingers. In certain embodiments, the grasping structure 320 is configured to fit within a gap between fans of the fan system 310 (see e.g., FIGS. 3B and 3C).

In certain embodiments, the multi-function handle component 305 includes a motherboard tray portion 330. In certain embodiments, the motherboard tray portion 330 is held firmly via a plurality of fasteners 332 so as to affix the multi-function handle component 305 to the motherboard. In certain embodiments, the motherboard tray portion 330 defines apertures that correspond to a motherboard specification so that there is no need to change the motherboard layout, the fan board layout, or a combination thereof. In certain embodiments, the motherboard specification includes an open compute project (OCP) specification such as the data center modular hardware system (DC-MHS) motherboard specification.

In certain embodiments, the multi-function handle component 305 includes an air baffle portion 340. In certain embodiments, the air baffle portion 340 increases the thermal support of the handle component. In certain embodiments, the air baffle portion 340 is positioned along an edge of the handle component 305. In certain embodiments, the air baffle portion 340 is positioned along a rear edge of the handle component 305. In certain embodiments, the air baffle portion 305 directs airflow to particular locations within the system. In certain embodiments, the particular locations include a processor area of the system. In certain embodiments, the air baffle portion defines one or more air flow windows 342. In certain embodiments, the one or more air flow windows 342 may be exposed to adjust air flow to a cooling target, such as a processor. In certain embodiments, the air baffle portion 340 includes a window obfuscation device 344. In certain embodiments, the window obfuscation device 344 is positioned in the air flow path of the air flow windows 342 to direct air flow generated by the fan system 310.

In certain embodiments, the multi-function handle component 305 defines a connector aperture 350. In certain embodiments, a connector 352 may be fit within the connector aperture 350. In certain embodiments, when the connector 352 is fit within the connector portion, the connector 352 may be attached to the motherboard.

Figure 4:
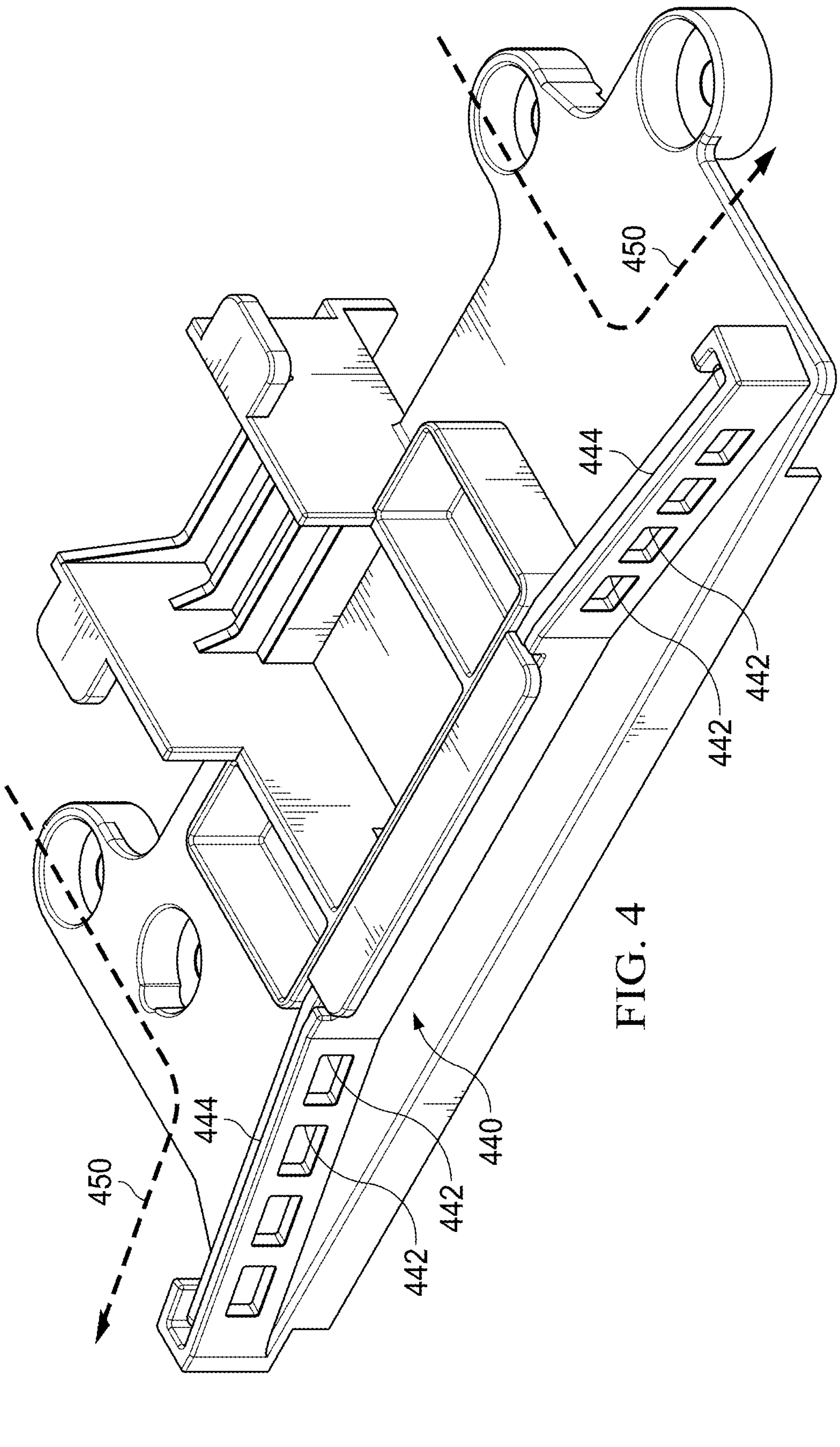
FIG. 4 shows a perspective functional view of a high performance module multifunction handle component.
Figure 5A:
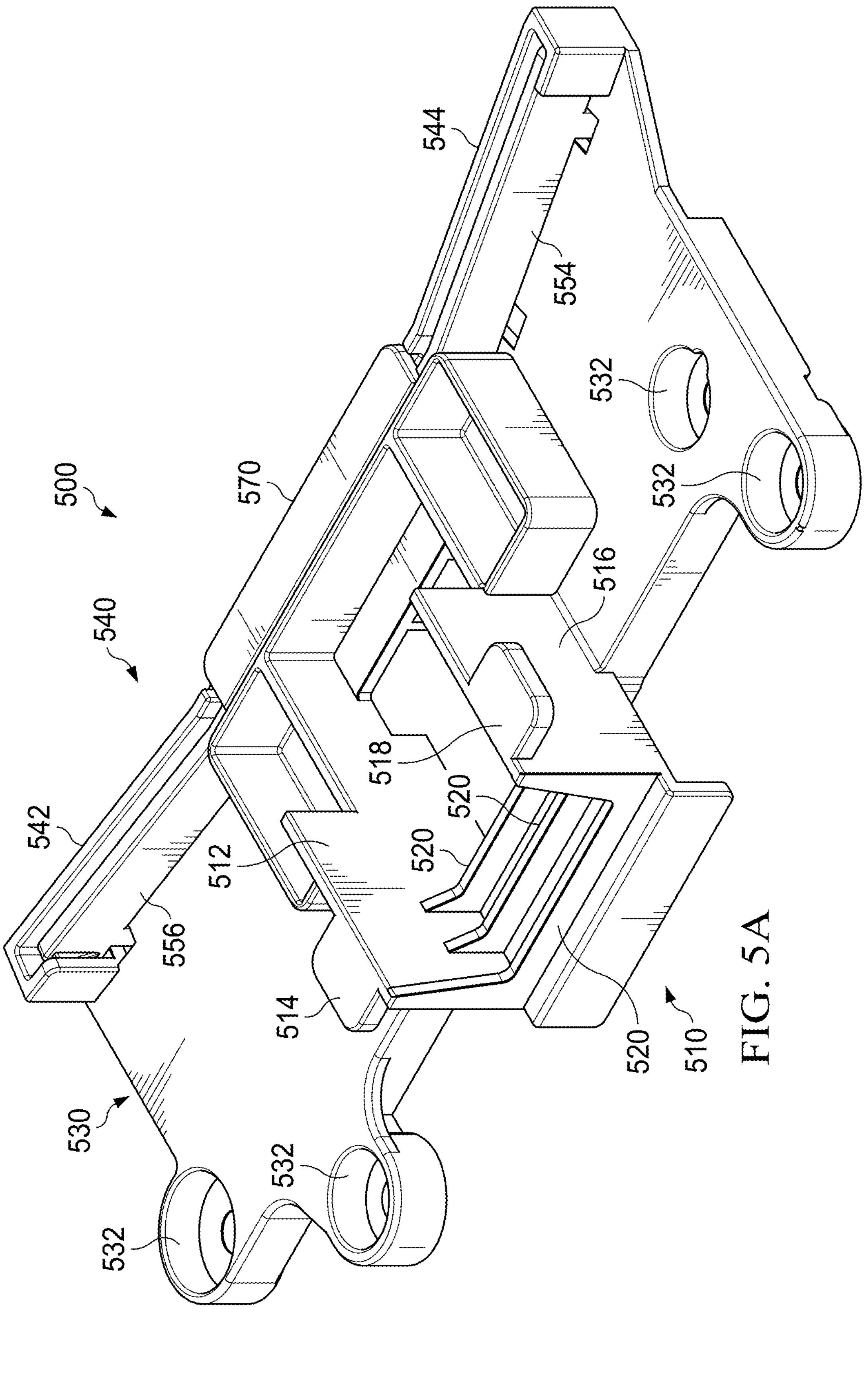
FIGS. 5A, 5B, 5C, 5D, 5E, 5F and 5G, generally referred to as FIG. 5, show a plurality of views of a high performance module multifunction handle component.
Figure 5B:
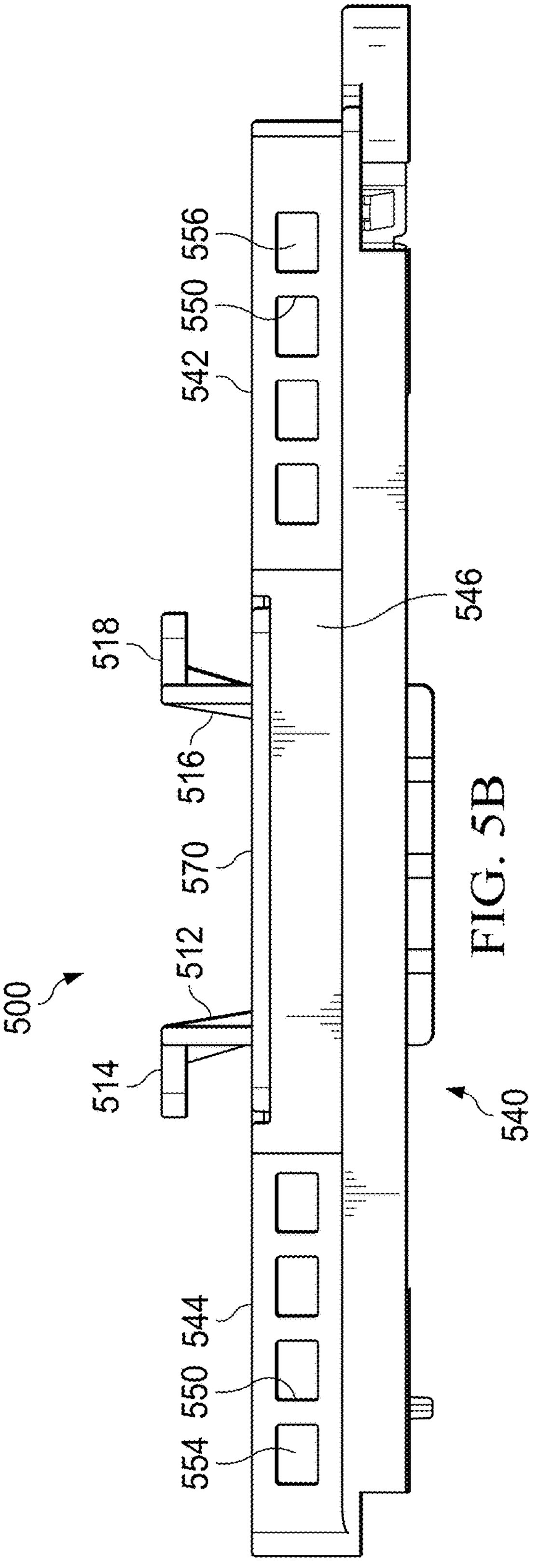
Figure 5C:
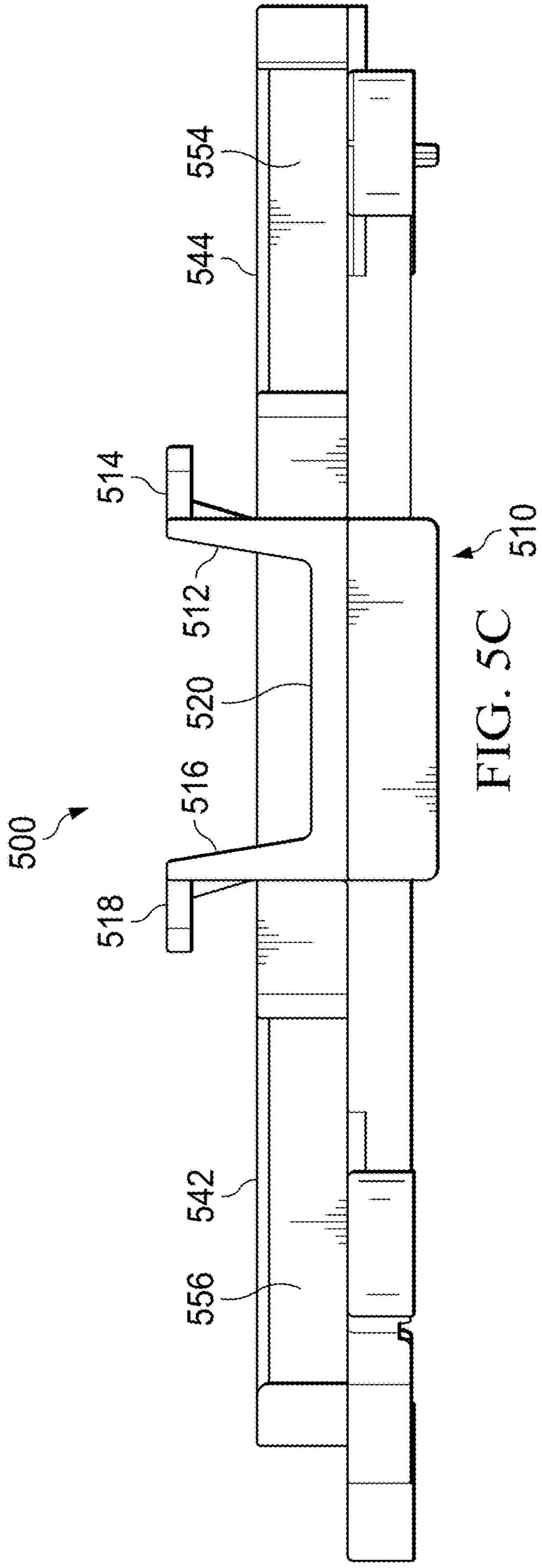
Figure 5D:
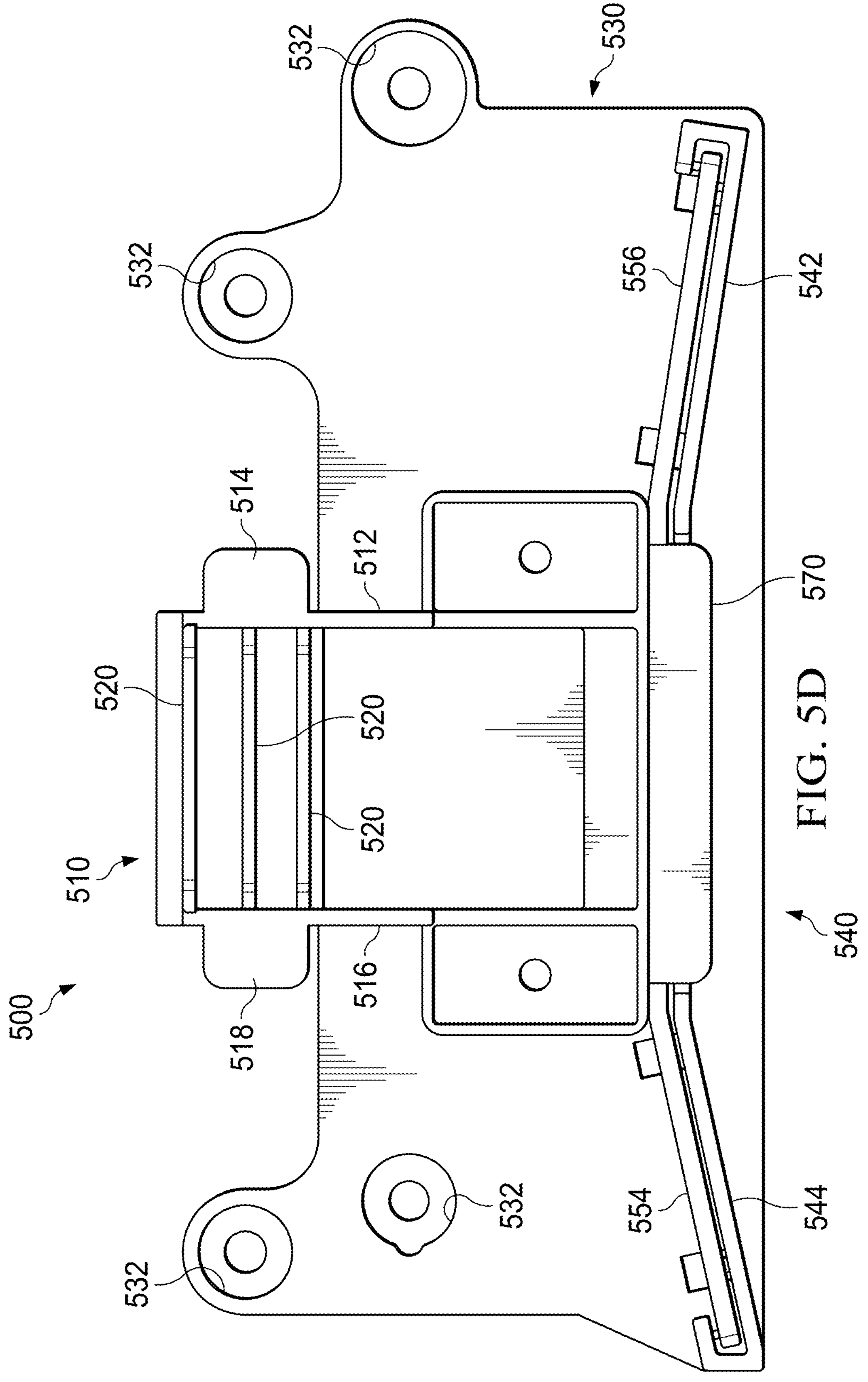
Figure 5E:
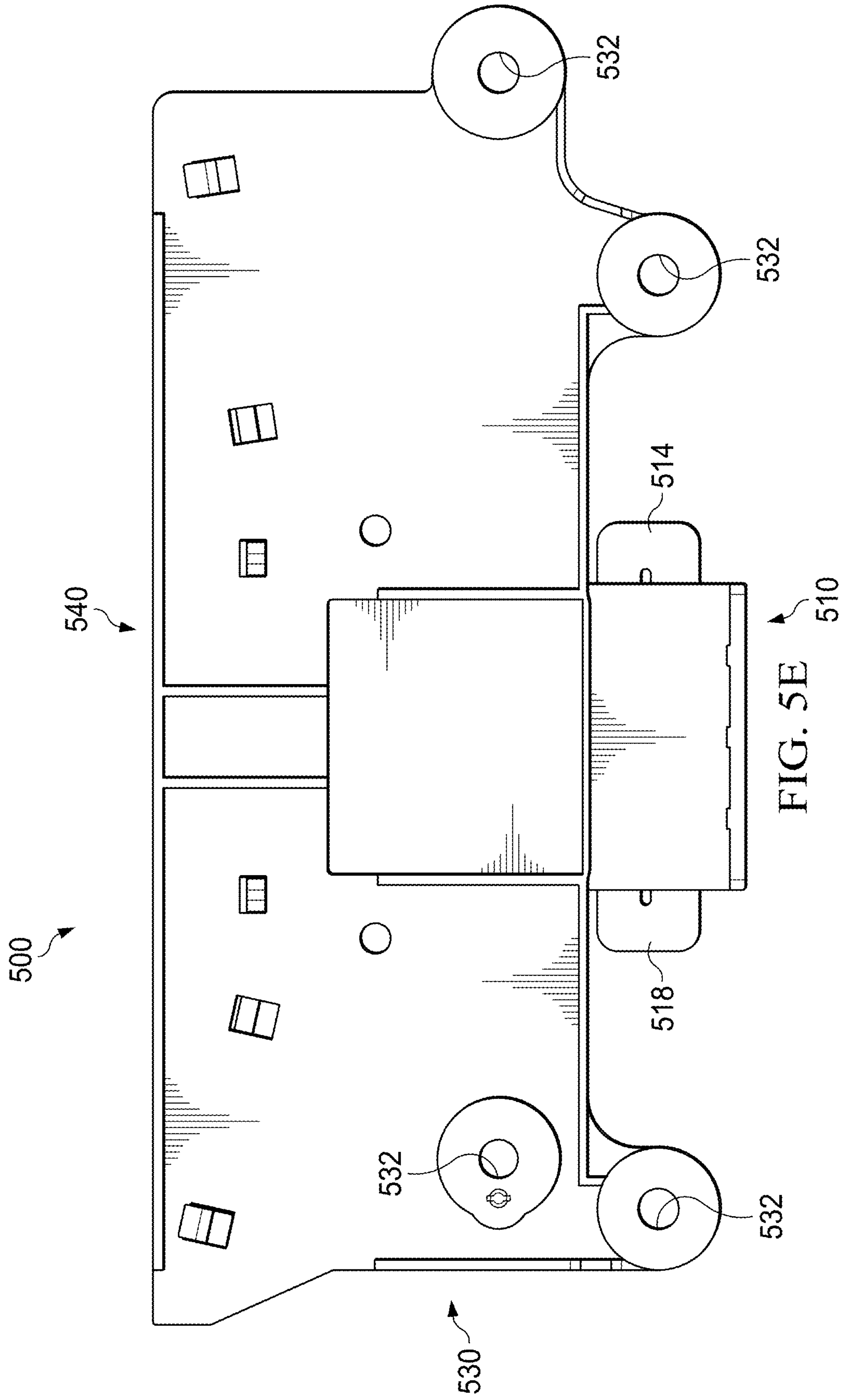
Figure 5F:
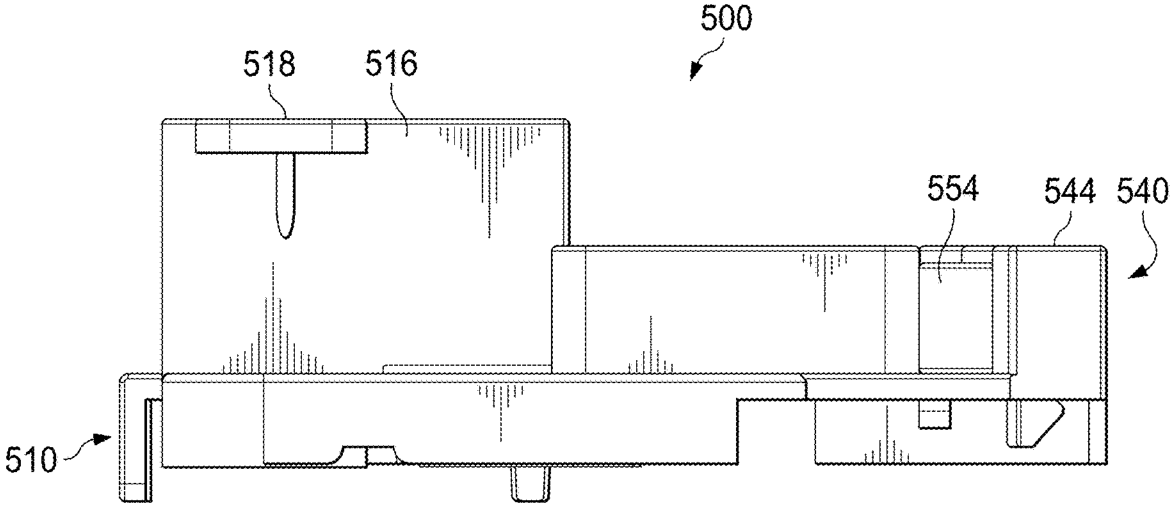
Figure 5G:
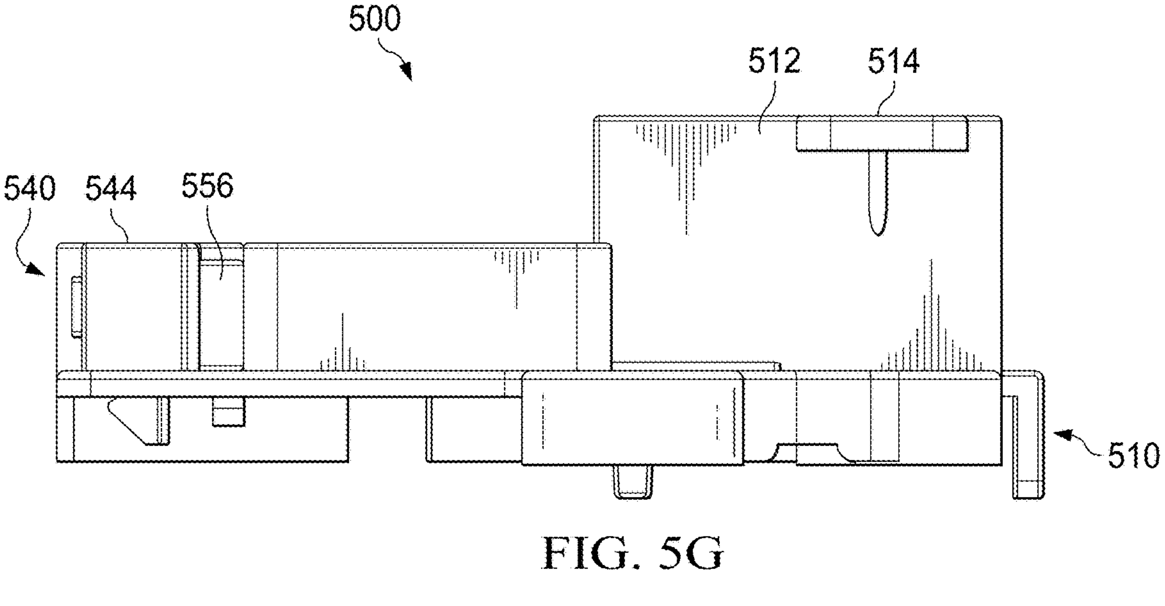

FIG. 4 shows a perspective functional view of a high performance module multi-function handle component 400. In certain embodiments, the high performance module multi-function handle 400 corresponds to multi-function handle 152.

In certain embodiments, the multi-function handle component 400 includes an air baffle portion 440. In certain embodiments, the air baffle portion 440 increases the thermal support of the handle component. In certain embodiments, the air baffle portion 440 is positioned along an edge of the handle component 400. In certain embodiments, the air baffle portion 440 is positioned along a rear edge of the handle component 400. In certain embodiments, the air baffle portion 400 directs airflow to particular locations within the system. In certain embodiments, the particular locations include a processor area of the system. In certain embodiments, the air baffle portion defines one or more air flow windows 442. In certain embodiments, the one or more air flow windows 442 may be exposed to adjust air flow to a cooling target, such as a processor. In certain embodiments, the air baffle portion 440 includes a window obfuscation device 444.

In certain embodiments, the window obfuscation device 444 is positioned in the air flow path of the air flow windows 442 to direct air flow generated by the fan system 410. In certain embodiments, when the window obfuscation device 444 is used, the airflow is directed around the multi-function handle component 400 as shows by air flow arrows 450.

FIGS. 5A, 5B, 5C, 5D, 5E, 5F and 5G, generally referred to as FIG. 5, show a plurality of views of a high performance module multi-function handle component 500. In certain embodiments, the high performance module multi-function handle 500 corresponds to multi-function handle 152.

In certain embodiments, the multi-function handle component 500 facilitates manipulation of a high performance module while facilitating air flow from a fan system. In certain embodiments, the multi-function handle component 500 includes a grasping structure 510 which minimizes the area obstructed by the handle. In certain embodiments, the grasping structure 510 of multi-function handle component 500 is configured as a multi-surface grasping structure. In certain embodiments, the multi-surface grasping structure 510 facilitates manipulation of the motherboard with two fingers.

In certain embodiments, the grasping structure 510 includes a first vertical wall 512, a first horizontal extension 514, or a combination thereof. In certain embodiments, the first horizontal extension 514 extends substantially perpendicularly from the first vertical wall 512.

In certain embodiments, the first horizontal extension 514 extends along a top edge of the first vertical wall 512. In certain embodiments, the first vertical wall 512, the first horizontal extension 512, or a combination thereof, are designed with a width that minimizes any effect on airflow across the grasping structure 510.

In certain embodiments, the grasping structure 510 includes a second vertical wall 516, a second horizontal extension 516, or a combination thereof. In certain embodiments, the second horizontal extension 518 extends substantially perpendicularly from the second vertical wall 516. In certain embodiments, the second horizontal extension 518 extends along a top edge of the second vertical wall 516. In certain embodiments, the second vertical wall 516, the second horizontal extension 516, or a combination thereof, are designed with a width that minimizes any effect on airflow across the grasping structure 510.

In certain embodiments, the grasping structure 510 includes one or more ribs 520 extending between an interior portion of the first vertical wall 512 and an interior portion of the second vertical wall 516. In certain embodiments, the one or more ribs 520 increase the structural integrity of the grasping structure 510 when the motherboard is manipulated via the grasping structure 510.

In certain embodiments, the multi-function handle component 500 includes a motherboard tray portion 530. In certain embodiments, the motherboard tray portion 530 is configured to attach to a motherboard of the server type information handling system. In certain embodiments, the motherboard tray portion 530 is held firmly against a motherboard via a plurality of fasteners so as to fix the multi-function handle component 500 to the motherboard. In certain embodiments, the motherboard tray portion 530 defines apertures 532 that correspond to a motherboard specification so that there is no need to change the motherboard layout, the fan board layout, or a combination thereof. In certain embodiments, the motherboard specification includes an open compute project (OCP) specification such as the data center modular hardware system (DC-MHS) motherboard specification. In certain embodiments, the motherboard tray 530 defines a connector aperture 534. In certain embodiments, the connector aperture 534 is configured to enable a motherboard connector to be connected to a motherboard.

In certain embodiments, the multi-function handle component 500 includes an air baffle portion 540. In certain embodiments, the air baffle portion 540 increases the thermal support of the handle component. In certain embodiments, the air baffle portion 540 is positioned along an edge of the handle component 500. In certain embodiments, the air baffle portion 540 is positioned along a rear edge of the handle component 500. In certain embodiments, the air baffle portion 540 directs airflow to particular locations within the system. In certain embodiments, the particular locations include a processor area of the system.

In certain embodiments, the air baffle portion 540 includes a first air baffle wall 542, a second air baffle wall 544, a third air baffle wall 546, or a combination thereof. In certain embodiments, the first air baffle wall 542 corresponds to a left air baffle wall and the second air baffle wall 544 corresponds to a right air baffle wall. In certain embodiments, the third air baffle wall 546 corresponds to a central air baffle wall.

In certain embodiments, the first air baffle wall 542 is angled away (i.e., towards the rear of the multi-function handle component 500) from the third air baffle wall 546. In certain embodiments, the first air baffle wall 542 defines one or more air flow windows 550. In certain embodiments, the one or more air flow windows 550 may be exposed to adjust air flow to a cooling target, such as a processor. In certain embodiments, the first air baffle wall 542 includes an associated window obfuscation device 554. In certain embodiments, the window obfuscation device 554 is positioned in the air flow path of the air flow windows 560 to direct air flow generated by a fan system.

In certain embodiments, the second air baffle wall 544 is angled away (i.e., towards the rear of the multi-function handle component 500) from the third air baffle wall 546. In certain embodiments, the second air baffle wall 544 defines one or more air flow windows 554. In certain embodiments, the one or more air flow windows 554 may be exposed to adjust air flow to a cooling target, such as a processor. In certain embodiments, the second air baffle wall 544 includes an associated window obfuscation device 556. In certain embodiments, the window obfuscation device 556 is positioned in the air flow path of the air flow windows 560 to direct air flow generated by a fan system.

In certain embodiments, the third air baffle wall 546 includes a center air baffle projection 570. In certain embodiments, the center air baffle projection 570 extends horizontally from the third air baffle wall 546. In certain embodiments, the center air baffle projection 570 extends from a top edge of the third air baffle wall 546. In certain embodiments, the center air baffle portion extends between the first air baffle wall 542 and the second air baffle wall 544.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A multi-function handle component for a server type information handling system, comprising:

a motherboard tray portion, the motherboard tray portion being configured to attach to a motherboard of the server type information handling system; and, a grasping structure physically attached to the motherboard tray portion, the grasping structure being configured to minimize obstruction of an airflow area of the multi-function handling component, the grasping structure being configured to fit within a gap between fans of a fan system of the server type information handling system.

2. The multi-function handle component of claim 1, further comprising:

an air baffle portion attached to the motherboard tray portion, the air baffle portion being configured to direct airflow across the multi-function handle component.

3. The multi-function handle component of claim 2, wherein:

the air baffle portion includes an air baffle wall, the air baffle wall defining an airflow aperture.

4. The multi-function handle component of claim 3, wherein:

the air baffle portion includes a center air baffle projection, the center air baffle projection extending along a top edge of the air baffle portion.

5. The multi-function handle component of claim 1, wherein:

the grasping structure includes a vertical wall extending from the motherboard tray portion and a horizontal extension extending from the vertical wall.

6. The multi-function handle component of claim 1, wherein:

the motherboard tray portion defines an attachment aperture, the attachment aperture corresponding to a connection portion of a motherboard of the server type information handling system, a location of the attachment aperture and of the connection portion being defined by a motherboard specification.

7. A server type information handling system comprising:

a processor;

a data bus coupled to the processor;

a motherboard, the processor and the data bus being associated with the motherboard; and, a multi-function handle component physically attached to the motherboard, the multi-function handle component comprising a motherboard tray portion, the motherboard tray portion being configured to attach to a motherboard of the server type information handling system; and, a grasping structure physically attached to the motherboard tray portion, the grasping structure being configured to minimize obstruction of an airflow area of the multi-function handling component, the grasping structure being configured to fit within a gap between fans of a fan system of the server type information handling system.

8. The server type information handling system of claim 7, wherein:

the multi-function handle further comprises an air baffle portion attached to the motherboard tray portion, the air baffle portion being configured to direct airflow across the multi-function handle component.

9. The server type information handling system of claim 8, wherein:

the air baffle portion includes an air baffle wall, the air baffle wall defining an airflow aperture.

10. The server type information handling system of claim 9, wherein:

the air baffle portion includes a center air baffle projection, the center air baffle projection extending along a top edge of the air baffle portion.

11. The server type information handling system of claim 7, wherein:

the grasping structure includes a vertical wall extending from the motherboard tray portion and a horizontal extension extending from the vertical wall.

12. The server type information handling system of claim 7, wherein:

the motherboard tray portion defines an attachment aperture, the attachment aperture corresponding to a connection portion of the motherboard, a location of the attachment aperture and of the connection portion being defined by a motherboard specification.

* * * * *